United States Patent [19]
Matsuda et al.

[11] Patent Number: 4,842,986
[45] Date of Patent: Jun. 27, 1989

[54] POSITIVELY WORKING RESIST MATERIAL

[75] Inventors: Nobuaki Matsuda; Tadayoshi Kokubo; Toshiaki Aoai; Akira Umehara; Yoshimasa Aotani, all of Kanagawa, Japan

[73] Assignee: Fuji Photo Film Co., Ltd., Kanagawa, Japan

[21] Appl. No.: 889,707

[22] Filed: Jul. 28, 1986

[30] Foreign Application Priority Data

Jul. 26, 1985 [JP] Japan .................................. 60-165512

[51] Int. Cl.$^4$ .............................................. G03C 1/76
[52] U.S. Cl. .................................... 430/270; 430/191; 430/192; 430/296; 430/326; 522/99; 522/148; 525/500; 525/501; 525/504; 525/134
[58] Field of Search ............... 430/192, 326, 296, 270, 430/191; 522/148, 99; 525/504, 500, 501, 134

[56] References Cited

U.S. PATENT DOCUMENTS

| 4,208,421 | 6/1980 | Bresak et al. | 428/447 |
| 4,491,508 | 1/1985 | Olson et al. | 528/26 |
| 4,600,685 | 7/1986 | Kitahohji et al. | 430/270 |
| 4,752,552 | 6/1988 | Aoai | 430/191 |
| 4,786,577 | 11/1988 | Aoai et al. | 430/192 |

Primary Examiner—Jack P. Brammer
Attorney, Agent, or Firm—Sughrue, Mion, Zinn, Macpeak & Seas

[57] ABSTRACT

A positively working resist material is disclosed, comprising a compound having at least one silyl ether group and capable of directly dissociating an Si-O-C bond upon irradiation with far ultraviolet rays, X-rays, an electron beam, or an ion beam. The resist material has high sensitivity to high energy radiation, excellent resistance to dry etching, and can be developed with an alkaline aqueous solution.

20 Claims, No Drawings

POSITIVELY WORKING RESIST MATERIAL

FIELD OF THE INVENTION

This invention relates to a positively working resist material having high sensitivity to far ultraviolet rays, X-rays, an electron beam, or an ion beam, and, more particularly, to a positively working resist material having excellent resistance to dry etching. The material can suitably be used for the formation of fine patterns required in the production of semiconductor elements, magnetic bubble memory elements, integrated circuits, etc.

BACKGROUND OF THE INVENTION

In the production of electronic parts, such as semiconductor elements, integrated circuits, etc., fine processing techniques by photo-etching are employed. Photo-etching is carried out, for example, by forming a photoresist layer on a silicon single-crystal wafer by spin coating, superposing a photomask having a desired pattern on the resist layer, forming an image by exposure to light, development, rinsing, and the like, and etching the solubilized area to form lines of several microns in width or windows. Precision of the products obtained by the above-described fine processing techniques depends mostly on the properties of the photoresist used, such as resolving power on a support base, sensitivity to radiation, adhesion to a support base, resistance to etching, and the like.

The photoresist includes negatively working resists which are insolubilized upon exposure and positively working resists which are solubilized upon exposure. In general, the negative resists are unsuitable as resists for fine processing due to their poor resolving power, though excellent in sensitivity. On the other hand, the positive resists are excellent in resolving power but inferior in sensitivity or etching resistance and, therefore, improvement of positive resists has been demanded.

Further, with the recent increasing demands for achieving higher densities and higher integration of semiconductor, etc., a process for forming patterns having a line width of 1 μm or less has been studied. According to this process, lithography using radiation of high energy, such as X-rays, an electron beam, an ion beam, etc., is adopted instead of the conventional lithography using light. However, it is difficult with such positively working radiation-sensitive organic high polymer materials used in this process to obtain high sensitivity, though such are excellent in resolving power, as compared with negatively working radiation-sensitive organic high polymer materials.

On the other hand, as the wiring of semiconductor elements, etc., becomes more minute, the conventional wet etching of the base after patterning of a resist layer has been replaced by dry etching. Therefore, resist materials are required to have high resistance to dry etching. However, the conventional resist materials have an essential defect in that attempts to obtain high sensitivities, particularly in the case of positive resist materials, are accompanied by reduction in resistance to dry etching. It has keenly been demanded, therefore, to develop resist materials having improved dry etching resistance.

To this effect, it has recently been discovered that polymers having an

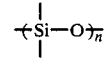

bond in the molecule exhibit high resistance to dry etching, particularly with O₂ plasma, and many compounds of this kind have been proposed for use as resist materials as described, e.g., in Japanese Patent Application (OPI) Nos. 141642/82 and 193451/84.

However, sensitivities reached with these resist materials are not always sufficient. These polymers are also disadvantageous in that they are hard to handle in the wafer process due to their low glass transition temperatures and that alkaline aqueous solutions commonly employed for positive photoresists cannot be used in the development.

SUMMARY OF THE INVENTION

An object of this invention is to provide a positively working resist material having high sensitivity to radiation of high energy, such as far ultraviolet rays, X-rays, an electron beam, etc., which is free from the above-described disadvantages associated with the conventional materials.

Another object of this invention is to provide a positively working resist material which can be developed with an alkaline aqueous solution.

The inventors have intensively examined various materials in order to discover a material appropriate radiation-sensitivity and dry etching-resistance. As a result, it has now been found that compounds having an —Si—O—C— bond in the molecule thereof fulfil the above requirements.

That is, when such compounds are irradiated with ultraviolet rays, etc., the exposed areas are effectively solubilized in a developing solution in the pattern formation according to a photographic etching technique to thereby provide a positive photoresist. It has been confirmed that the thus patterned photoresist films have less film thickness loss even when irradiated with oxygen plasma, demonstrating excellent resistance to oxygen plasma. When an aluminum thin film base was subjected to dry etching with chlorine gases using the above resist film, a fine pattern could be formed owing to strong dry etching resistance of the resist film.

Since the above-described resist materials undergo crosslinking or decomposition upon irradiation with radiation of high energy, e.g., electron rays, X-rays, etc., they are applicable as radiation-sensitive resist materials. The patterned resist films obtained possess significantly improved resistance to dry etching.

The present invention provides a positively working resist material containing a compound having at least one silyl ether group represented by formula (I) and capable of directly dissociating an Si—O—C bond upon irradiation with far ultraviolet rays, X-rays, an electron beam, or an ion beam.

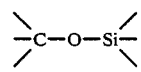

DETAILED DESCRIPTION OF THE INVENTION

The compounds having the silyl ether group of formula (I) according to the present invention preferably include those represented by formula (II), (III), or (IV)

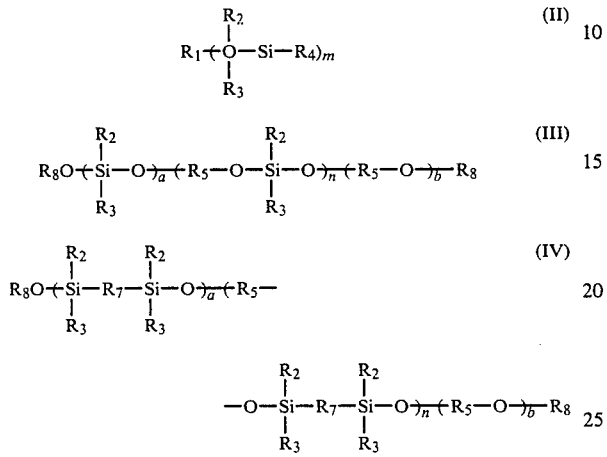

wherein $R_1$ represents a substituted or unsubstituted m-valent aliphatic or aromatic hydrocarbon group; $R_2$, $R_3$, and $R_4$ (which may be the same or different) each represents a hydrogen atom, an alkyl group, an alkenyl group, a substituted or unsubstituted aryl group, a substituted or unsubstituted aralkyl group, a halogen atom or $-OR_6$, preferably an alkyl group having from 1 to 4 carbon atoms, a chlorine atom, or $-OR_6$, and more preferably an alkyl group having from 1 to 4 carbon atoms or $-OR_6$; $R_5$ and $R_7$ each represents a substituted or unsubstituted divalent aliphatic or aromatic hydrocarbon residue, and preferably a divalent aliphatic or aromatic hydrocarbon residue having a hydrophilic group (hereinafter described in detail), a urethane group, a ureido group, an amido group or an ester group; $R_6$ represents a substituted or unsubstituted alkyl group, a substituted or unsubstituted aryl group or a substituted or unsubstituted aralkyl group, and preferably an alkyl group having from 1 to 8 carbon atoms or an aryl group having from 6 to 15 carbon atoms; $R_5$ and $R_6$ may be taken together to form a part of an aliphatic or an aromatic ring; $R_8$ represents a hydrogen atom, a substituted or unsubstituted alkyl, aryl, or acyl group or

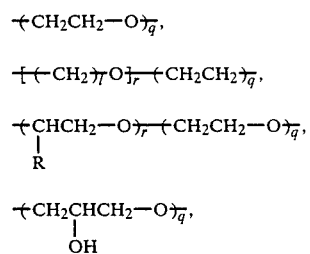

and preferably a hydrogen atom, an alkyl group having from 1 to 4 carbon atoms or

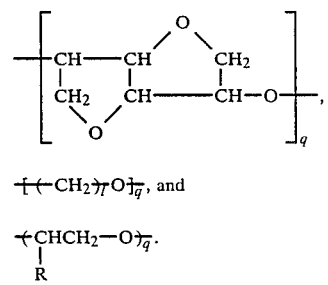

m and n each represents a positive integer, and preferably m represents an integer of from 1 to 1000, more preferably 1 to 200, and n represents an integer of from 1 to 500, more preferably 1 to 100; and a and b each represents 0 or 1.

In the above-described formulae (III) and (IV), the hydrophilic group specifically includes the groups $-\!(\!CH_2CH_2-O\!)_{\overline{q}}$, $-\!(\!(\!CH_2\!)_{\overline{r}}O\!)_{\overline{r}}\!(\!CH_2CH_2\!)_{\overline{q}}$, $-\!(\!CHCH_2-O\!)_{\overline{r}}\!(\!CH_2CH_2-O\!)_{\overline{q}}$,
   |
   R $-\!(\!CH_2CHCH_2-O\!)_{\overline{q}}$,
      |
     OH

$-\!(\!(\!CH_2\!)_{\overline{r}}O\!)_{\overline{q}}$, and $-\!(\!CHCH_2-O\!)_{\overline{q}}$.
  |
  R wherein l represents an integer of from 1 to 4; r and q each represents an integer of 2 or more, preferably an integer of from 2 to 100, and more preferably an integer of from 2 to 20; and R represents an alkyl group or a substituted or unsubstituted phenyl group. The particularly preferred among these hydrophilic groups are group of $-\!(\!CH_2CH_2-O\!)_{\overline{q}}$ Of the compounds having a silyl ether group as represented by formula (II), (III), or (IV), the preferred are the compounds having at least one of a urethane group, a ureido group, an amido group, and an ester group, and the more preferred at the compounds having at least one of a urethane group, a ureido group, an amido group, and an ester group and a hydrophilic group.

Specific examples of the compounds having at least one silyl ether group of formula (I) which can be used in the present invention are shown below, but they are not intended to limit the present invention:

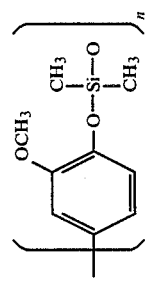
No. 1
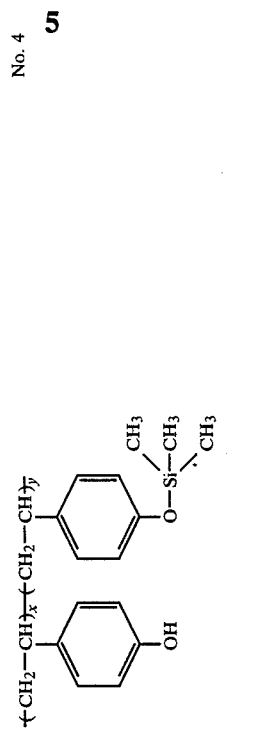
No. 3
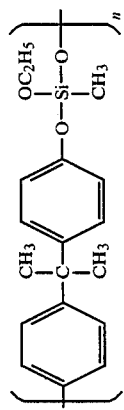
No. 5
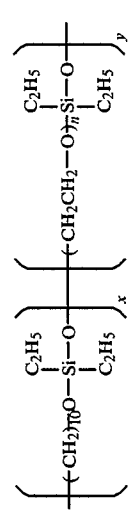
No. 7
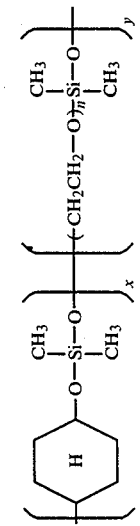
No. 9
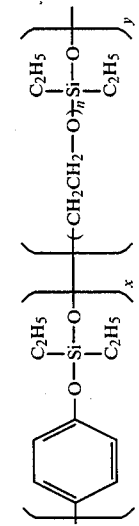
No. 11
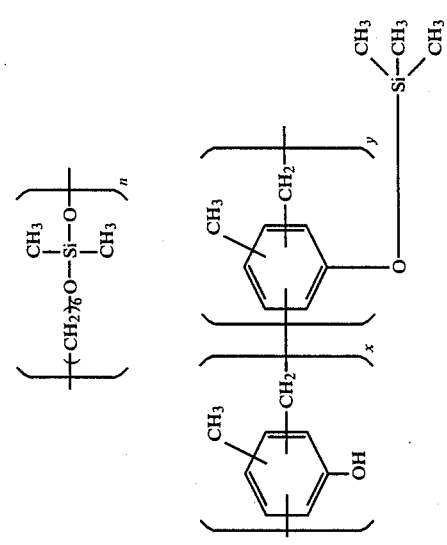
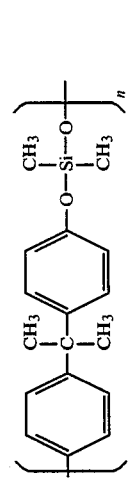
No. 5
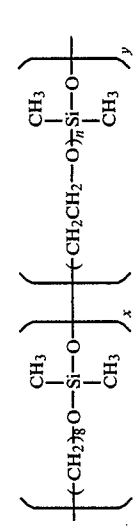
No. 7
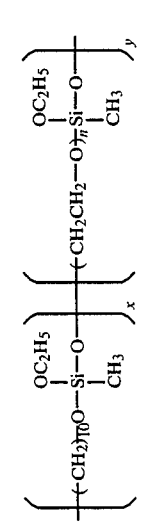
No. 9
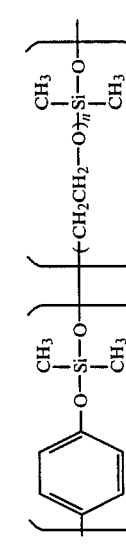
No. 11

-continued

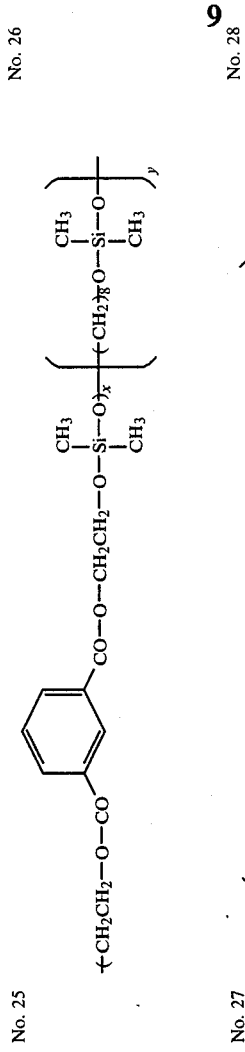
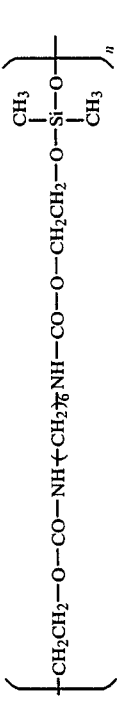
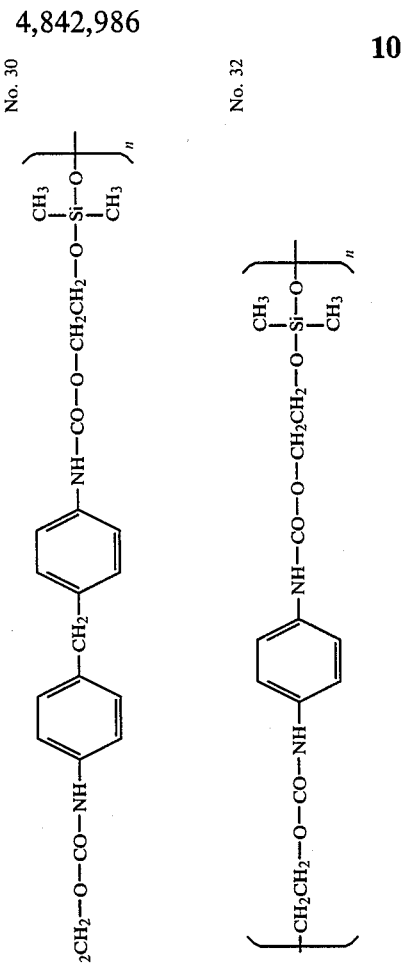
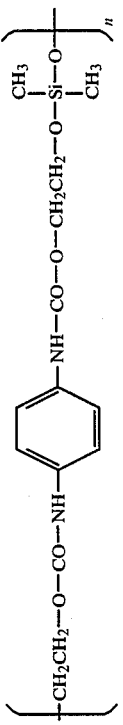
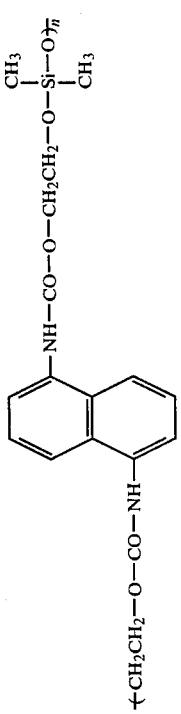
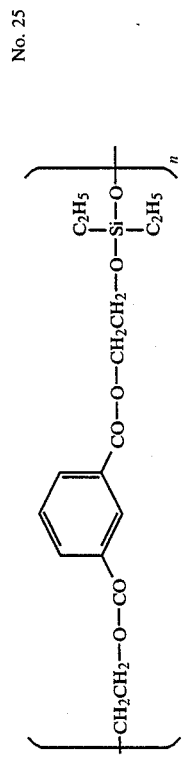
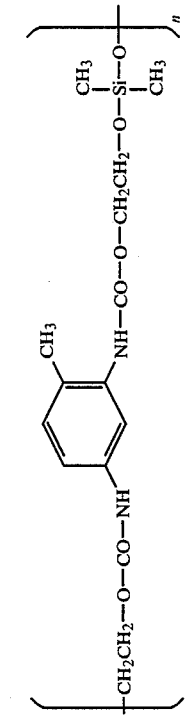
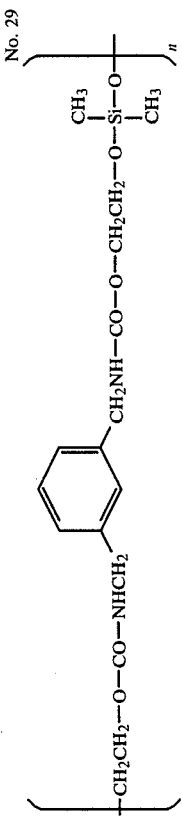
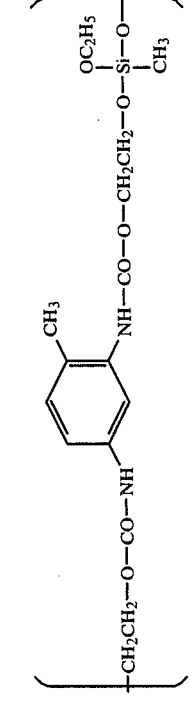
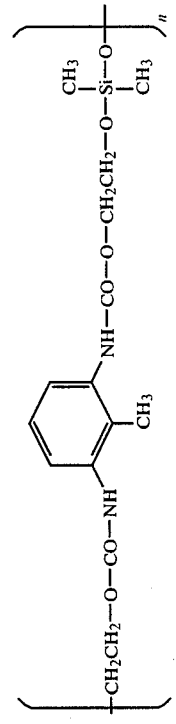

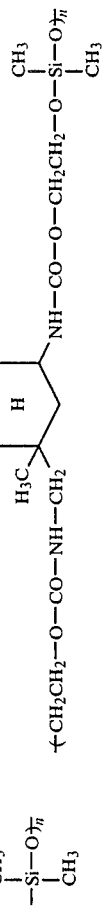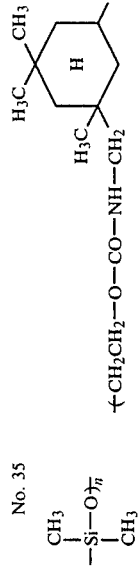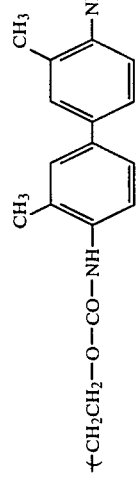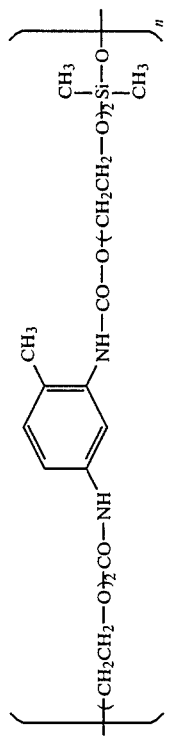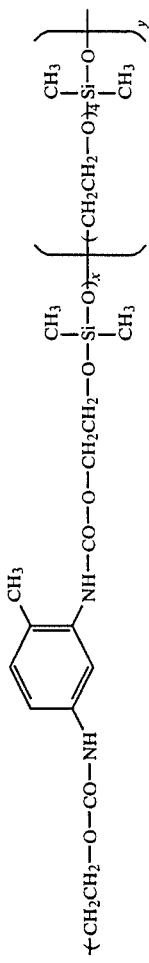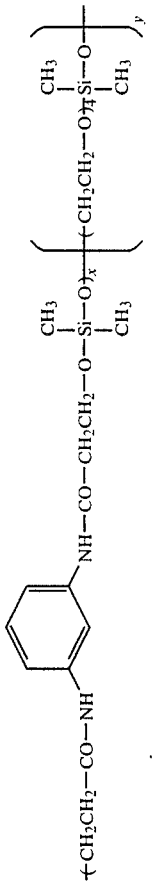

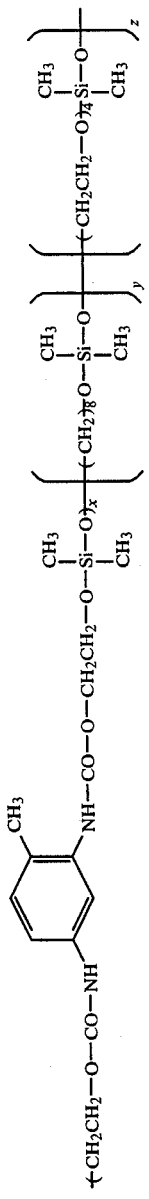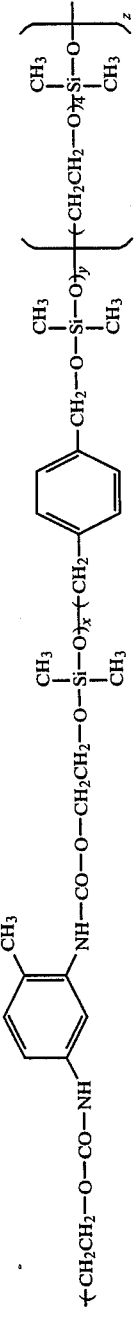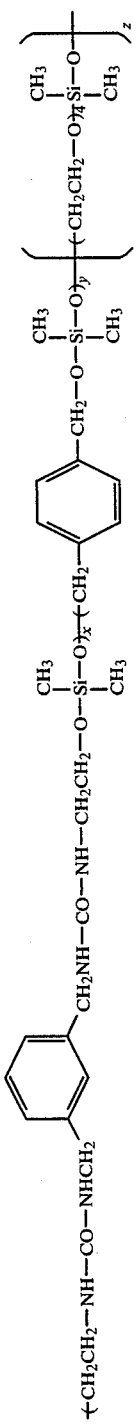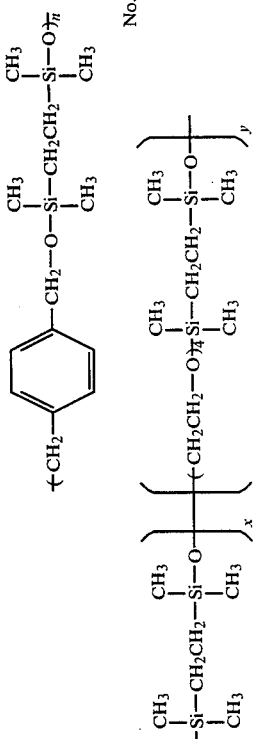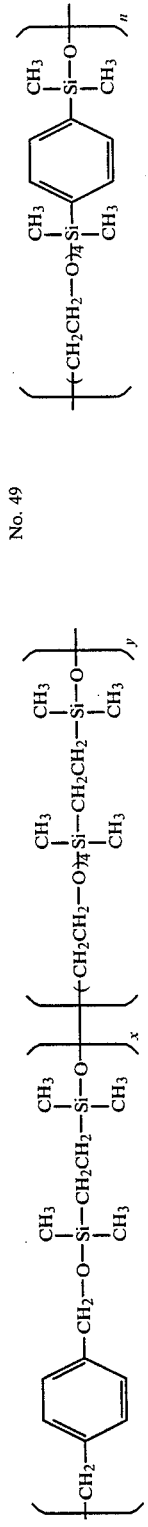

wherein n represents an integer of 2 or more; and x, y, and z each represents a molar ratio, and specifically x=10 to 85 mol %, y=5 to 80 mol %, and z=10 to 85 mol % in Compound Nos. 45 to 47; or x=5 to 90 mol %, and y=10 to 95 mol % in Compound Nos. 3, 4, 7 to 19, 21, 26, 37, 41 to 44, and 49.

The far ultraviolet- or radiation-sensitive resist material comprising the compound of the present invention efficiently induces cleavage of the Si—O—C bond upon irradiation of far ultraviolet rays or radiation thereby to selectively solubilize irradiated areas in a developing solution. Hence, it is sufficient in principle for the compounds to be used as resist materials to contain one Si—O—C bond per molecule.

The resist materials according to the present invention exhibit very high resistance against oxygen plasma. Even when they are allowed to stand in an oxygen plasma atmosphere for a long period of time, they show only low film thickness loss. This is believed ascribable to formation of a continuous layer of $SiO_2$ on the resist film surface by exposure to oxygen plasma.

Therefore, formation of a fine pattern can be carried out with great advantage by previously subjecting the resist material to oxygen plasma treatment in various dry etching processes. Moreover, the excellent dry etching-resistance of the resist materials of the invention makes it possible to reduce a resist film thickness, bringing about improvement in pattern resolving power, which offers a great advantage in fine processing.

Further, the resist materials of the present invention can be used to particular advantage in the case of processing a base having a difference in surface level, in which a leveling layer is previously coated on the base and a resist is then formed thereon. In this case, use of the resist materials of the invention makes it possible to achieve high precision processing with a reduced film thickness.

The compounds having silyl ether group capable of being decomposed by irradiation of far ultraviolet rays may be used alone as the resist material, but is preferably combined with an alkali-soluble resin. The alkali-soluble resin to be used suitably includes polyvinylphenol resins and novolak phenol resins. Specific examples are Maruzen Resin M (produced by Maruzen Oil Company, Ltd.), phenol-formaldehyde resins, p-cresol-formaldehyde resins, m-cresol-formaldehyde resins, and the like. The above-recited phenol resins may be used in combination with condensation products of phenol or cresol substituted with an alkyl group having from 3 to 8 carbon atoms and formaldehyde, such as a t-butyl-phenol-formaldehyde resin, etc, as described in U.S. Pat. No. 4,123,279. Such an alkali-soluble resin is usually used in an amount of from about 30 to about 90% by weight based on the total weight of the resist material.

If desired, the resist materials according to the present invention can further contain dyes, plasticizers, compounds for increasing decomposition efficiency (the so-called sensitizers), and the like. Suitable dyes to be added include oil-soluble dyes and basic dyes. Specific examples of these dyes are Oil Yellow #101, Oil Yellow #130, Oil Pink #312, Oil Green BG, Oil Blue BOS, Oil Blue #603, Oil Black BY, Oil Black BS, and Oil Black T-505 (all produced by Orient Chemical Co., Ltd.); Crystal Violet (CI 42555), Methyl Violet (CI 42535). Rhodamine B (CI 45170B), Malachite Green (CI 42000), Methylene Blue (CI 52015), etc.

In carrying out the present invention, the silyl ether-containing compound of the invention is dissolved in a solvent therefor, and the solution is coated on a support. The solvents to be used include ethylene dichloride, cyclohexane, methyl ethyl ketone, ethylene glycol monomethyl ether, ethylene glycol monoethyl ether, 2-ethoxyethyl acetate, xylene, toluene, ethyl acetate, butyl acetate, carbon tetrachloride, etc., either alone or in combination thereof.

The above resist solution is spin-coated on an element support, pre-baked at an appropriate temperature and irradiated with far ultraviolet rays or radiation according to the desired pattern. After the irradiation, the irradiated areas are selectively dissolved away with a developing solution comprising an alkaline aqueous solution containing tetramethylammonium hydroxide, choline, caustic alkalis, etc. to thereby obtain a resist pattern.

Light sources to be used for exposure include an ultra-high pressure mercury lamp, a xenon-mercury lamp, eximer lasers using Kr, etc., X-rays, an electron beam, an ion beam, etc.

The term "far ultraviolet rays" as used herein means ultraviolet rays having wavelengths of about 350 nm or less.

This invention will now be illustrated in greater detail with reference to the following examples, but it should be understood that they are not intended to limit the present invention. In these examples, all the percents and ratios are given by weight unless otherwise indicated.

EXAMPLE 1

A 15% solution of Compound No. 27 having an average molecular weight of 6500 (as determined by gel permeation chromatography using polystyrene as standard) in 2-ethoxyethyl acetate was spin-coated on a silicon wafer at 2,000 rpm to form a polymer film having a dry thickness of 0.5 μm. The polymer film was pre-baked at 90° C. for 30 minutes, followed by irradiating through a quartz mask using a 500 W xenon-mercury lamp (irradiance: 12 mW/cm$^2$ at 254 nm). After the irradiation, the material was dipped in a 3% aqueous solution of tetramethylammonium hydroxide for 60 seconds to solubilize the irradiated areas. As a result, a positive resist pattern having a resolving power of 1 μm line was produced.

The thus patterned resist film was subjected to etching with $O_2$ gas at a power of 50 W by the use of a parallel plate type plasma etching apparatus. Then, the etched film thickness was measured using a light-interference type film thickness gauge, Model TFM 120 (produced by Orc Co., Ltd.), and the rate of etching was determined in terms of the film thickness per etching time and found to be less than 10 Å per minute.

For comparison, the same procedures as described above were repeated, except using a commercially available positive resist, HPR-204 (produced by Philip A. Hunt Chemical Corporation). In this case, the rate of etching as determined above was 600 Å per minute.

As is demonstrated by the above results, the silyl ether polymer of the present invention has high dry etching resistance against $O_2$ plasma.

EXAMPLE 2

Compound No. 43 having an average molecular weight of 5400 (as determined by gel permeation chromatography using polystyrene as standard) was mixed with a novolak resin (average molecular weight: ca. 3,000; obtained by condensing a 1/1 mixture of m-cresol and p-cresol with formaldehyde in the presence of a sulfuric acid catalyst) at a mixing ratio of 50:50, and the mixture was dissolved in 2-ethoxyethanol to prepare a 20% solution. The resulting solution was spin-coated on a silicon wafer to form a resist film having a dry thickness of about 0.5 μm.

The resist film was irradiated in the same manner as described in Example 1 to form a pattern. The rate of etching with $O_2$ plasma as determined above was found to be 10 Å or less per minute.

EXAMPLE 3

The resist film as obtained in Example 2 was irradiated with an electron beam accelerated at a voltage of 20 KV, and then developed with a 2% aqueous solution of tetramethylammonium hydroxide for 60 seconds, whereby the areas irradiated with an exposure dose of $5 \times 10^{-6}$ C/cm$^2$ were completely dissolved, indicating that a positive image can be obtained by irradiation with an electron beam.

While the invention has been described in detail and with reference to specific embodiments thereof, it will be apparent to one skilled in the art that various changes and modifications can be made therein without departing from the spirit and scope thereof.

What is claimed is:

1. A positively working resist material consisting essentially of a compound having at least one silyl ether group and an alkali-soluble resin in an amount of from about 30 to about 90% by weight based on the total weight of the resist material, and said compound having at least one silyl ether group is present in an amount sufficient to render the positively working resist material alkali-insoluble but which renders the material alkali-soluble upon irradiation with far ultraviolet rays, X-rays, an electron beam, or an ion beam, and said compound is selected from the group consisting of compounds represented by formulae (II), (III), and (IV)

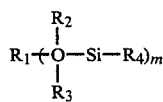  (II)

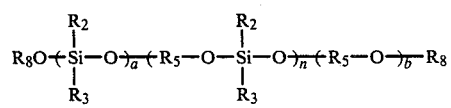  (III)

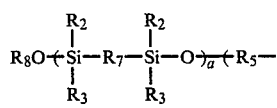  (IV)

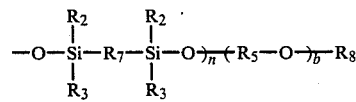

wherein $R_1$ represents a substituted or unsubstituted m-valent aliphatic or aromatic hydrocarbon group; $R_2$, $R_3$, and $R_4$ each represents a hydrogen atom, an alkyl group, an alkenyl group, a substituted or unsubstituted aryl group, a substituted or unsubstituted aralkyl group, a halogen atom, or $-OR_6$, where $R_6$ represents a substituted or unsubstituted alkyl group, a substituted or unsubstituted aryl group, or a substituted or unsubstituted aralkyl group; $R_5$ and $R_7$ each represents a substituted or unsubstituted divalent aliphatic or aromatic hydrocarbon residue; or $R_5$ together with $R_6$ in $R_2$ or $R_3$ form a part of an aliphatic or aromatic ring; $R_8$ represents a hydrogen atom, a substituted or unsubstituted alkyl group, a substituted or unsubstituted aryl group, a substituted or unsubstituted acyl group, or

m and n each represents a positive integer; and a and b each represents 0 or 1.

2. A positively working resist material as in claim 1, wherein said compound is

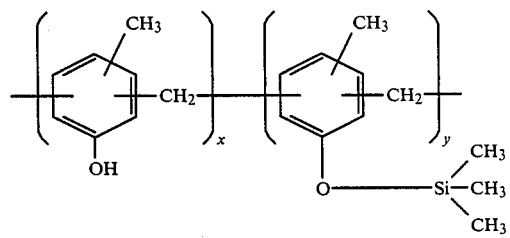

or

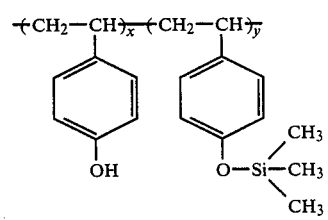

3. A positively working resist material as in claim 1, wherein $R_2$, $R_3$, and $R_4$ each represents an alkyl group having from 1 to 4 carbon atoms, a chlorine atom or $-OR_6$.

4. A positively working resist material as in claim 1, wherein $R_6$ represents an alkyl group having from 1 to 8 carbon atoms or an aryl group having from 6 to 15 carbon atoms.

5. A positively working resist material as in claim 1, wherein $R_8$ represents a hydrogen atom, an alkyl group having from 1 to 4 carbon atoms, or

wherein $R_2$, $R_3$, and $R_4$ are the same as defined in claim 2.

6. A positively working resist material as in claim 1, wherein m represents an integer of from 1 to 1000.

7. A positively working resist material as in claim 1, wherein m represents an integer of from 1 to 200.

8. A positively working resist material as in claim 1, wherein n represents an integer of from 1 to 500.

9. A positively working resist material as in claim 8, wherein n represents an integer of from 1 to 100.

10. A positively working resist material as in claim 1, wherein said divalent aliphatic or aromatic hydrocarbon residue as represented by $R_5$ or $R_7$ contains at least one of a urethane group, a ureido group, an amido group, and an ester group.

11. A positively working resist material as in claim 10, wherein said divalent aliphatic or aromatic hydrocarbon group further contains a hydrophilic group.

12. A positively working resist material as in claim 11, wherein said hydrophilic group is selected from the group of

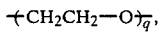

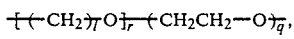

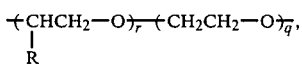

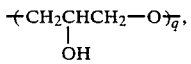

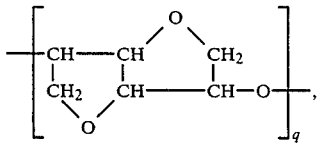

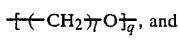

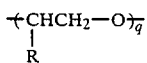

wherein l represents an integer of from 1 to 4; r and q each represents an integer of 2 or more; and R represents an alkyl group or a substituted or unsubstituted phenyl group.

13. A positively working resist material as in claim 12, wherein r and q each represents an integer of from 2 to 100.

14. A positively working resist material as in claim 13, wherein r and q each represents an integer of from 2 to 20.

15. A positively working resist material as in claim 1, wherein said alkali-soluble resin is a polyvinylphenol resin or a novolak phenol resin.

16. A positively working resist material as in claim 1, wherein said compound is solubilized by irradiation with far ultraviolet rays, X-rays, an electron beam, or an ion beam.

17. A positively working resist material as in claim 1, wherein said compound has from 1 to 1000 repeating units of the silyl ether group represented by formula (I).

18. A positively working resist material as in claim 17, wherein said repeating unit is from 1 to 200.

19. A positively working resist material consisting of a compound having at least one silyl ether group and an alkali-soluble resin in an amount of from about 30 to about 90% by weight based on the total weight of the resist material, and said compound having at least one silyl ether group is present in an amount sufficient to render the positively working resist material alkali-insoluble but which renders the material alkali-soluble upon irradiation with far ultraviolet rays, X-rays, an electron beam, or an ion beam and said compound is selected from the group consisting of compounds represented by formulae (II), (III), and (IV)

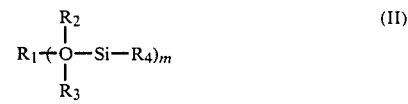

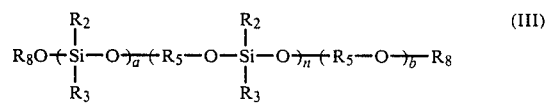

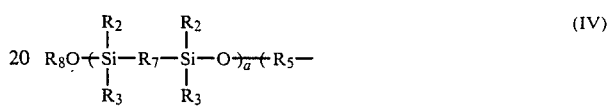

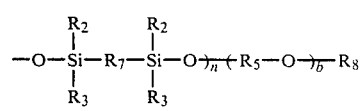

wherein $R_1$ represents a substituted or unsubstituted m-valent aliphatic or aromatic hydrocarbon group; $R_2$, $R_3$, and $R_4$ each represents a hydrogen atom, an alkyl group, an alkenyl group, a substituted or unsubstituted aryl group, a substituted or unsubstituted aralkyl group, a halogen atom, or —$OR_6$, wherein $R_6$ represents a substituted or unsubstituted alkyl group, a substituted or unsubstituted aryl group, or a substituted or unsubstituted aralkyl group; $R_5$ and $R_7$ each represents a substituted or unsubstituted divalent aliphatic or aromatic hydrocarbon residue; or $R_5$ together with $R_6$ in $R_2$ or $R_3$ form a part of an aliphatic or aromatic ring; $R_8$ represents a hydrogen atom, a substituted or unsubstituted alkyl group, a substituted or unsubstituted aryl group, a substituted or unsubstituted acyl group, or

m and n each represents a positive integer; and a and b each represents 0 or 1.

20. A positively working resist material as in claim 19, wherein said compound is

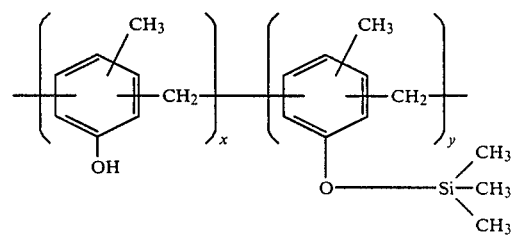

or

-continued $+CH_2-CH)_x+CH_2-CH)_y$ with pendant phenyl-OH and phenyl-O-Si(CH₃)₃ groups

* * * * *